(12) United States Patent
Shimoda et al.

(10) Patent No.: US 7,122,587 B2
(45) Date of Patent: *Oct. 17, 2006

(54) SEMICONDUCTOR ENCAPSULATING FLAME RETARDANT EPOXY RESIN COMPOSITION AND SEMICONDUCTOR DEVICE

(75) Inventors: Tarou Shimoda, Usui-gun (JP);
Shoichi Osada, Usui-gun (JP);
Hiroyuki Takenaka, Usui-gun (JP);
Shingo Ando, Usui-gun (JP);
Kazutoshi Tomiyoshi, Chiyoda-ku (JP);
Toshio Shiobara, Usui-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 320 days.

This patent is subject to a terminal disclaimer.

(21) Appl. No.: 10/638,337

(22) Filed: Aug. 12, 2003

(65) Prior Publication Data

US 2004/0072968 A1   Apr. 15, 2004

(30) Foreign Application Priority Data

Oct. 10, 2002   (JP)   ............................. 2002-297352

(51) Int. Cl.
*C08K 3/10* (2006.01)
*C08K 5/06* (2006.01)
*H01L 23/29* (2006.01)

(52) U.S. Cl. ...................... 523/452; 257/789; 257/793; 523/458

(58) Field of Classification Search ...................... None
See application file for complete search history.

(56) References Cited

U.S. PATENT DOCUMENTS 4,272,382 A * 6/1981 Ogata et al. ................. 210/660
6,596,893 B1 * 7/2003 Nakacho et al. ............. 558/157
6,783,859 B1 * 8/2004 Osada et al. ................. 428/413
6,905,768 B1 * 6/2005 Tada et al. ................... 428/413

FOREIGN PATENT DOCUMENTS

| JP | 10-259292 A | 9/1998 |
| JP | 2843244 B2 | 10/1998 |
| JP | 2001192535 A | * 7/2001 |
| JP | 2001316565 A | * 11/2001 |
| JP | 2001329143 A | * 11/2001 |
| JP | 2001329144 A | * 11/2001 |
| JP | 2002012741 A | * 1/2002 |
| JP | 2002047393 A | * 2/2002 |

* cited by examiner

*Primary Examiner*—Robert Sellers
(74) *Attorney, Agent, or Firm*—Birch, Stewart, Kolasch & Birch, LLP

(57) ABSTRACT

A flame retardant epoxy resin composition for semiconductor encapsulation includes as essential components, (A) an epoxy resin, (B) a curing agent, (C) an inorganic filler, and (D) a phosphazene compound of the average compositional formula (1) having a melting point of 110–130° C.,

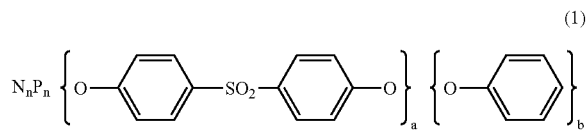

(1)

wherein a, b and n are numbers satisfying $0<a\leq 0.05n$, $1.90n\leq b<2n$, $2a+b=2n$, and $3\leq n\leq 6$, the composition being substantially free of bromides and antimony compounds.

6 Claims, 2 Drawing Sheets

SEMICONDUCTOR ENCAPSULATING FLAME RETARDANT EPOXY RESIN COMPOSITION AND SEMICONDUCTOR DEVICE

This invention relates to a flame retardant epoxy resin composition for semiconductor encapsulation which is effectively moldable and cures into a product having flame retardance and moisture-proof reliability despite the absence of bromides (e.g., brominated epoxy resins) and antimony compounds (e.g., antimony trioxide). It also relates to a semiconductor device encapsulated with a cured product of the composition.

BACKGROUND OF THE INVENTION

The current mainstream of semiconductor devices resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. Semiconductor devices are now used in every area of the modern society, for example, in electric appliances and computers. As a guard against accidental fire, the semiconductor devices are required to be flame retardant.

In semiconductor encapsulating epoxy resin compositions, halogenated epoxy resins combined with antimony trioxide ($Sb_2O_3$) are often included in order to enhance flame retardance. This combination of a halogenated epoxy resin with antimony trioxide has great radical-trapping and air-shielding effects in the vapor phase, thus conferring a high fire-retarding effect.

However, the halogenated epoxy resins generate noxious gases during combustion, and antimony trioxide has powder toxicity. Given their negative impact on human health and the environment, it is desirable to entirely exclude these fire retardants from resin compositions.

In view of the above demand, studies have been conducted on the use of hydroxides such as $Al(OH)_3$ and $Mg(OH)_2$ or phosphorus based fire retardants such as red phosphorus and phosphates in place of halogenated epoxy resins and antimony trioxide. Unfortunately, various problems arise from the use of these alternative compounds. The hydroxides such as $Al(OH)_3$ and $Mg(OH)_2$ have less flame retardant effects and must be added in larger amounts in order that epoxy resin compositions be flame retardant. Then the viscosity of these compositions increases to a deleterious level to molding, causing molding defects such as voids and wire flow. On the other hand, the phosphorus-containing fire retardants such as red phosphorus and phosphates added to epoxy resin compositions can be hydrolyzed to generate phosphoric acid when the semiconductor devices are exposed to hot humid conditions. The phosphoric acid generated causes aluminum conductors to be corroded, detracting from reliability.

To solve these problems, Japanese Patent No. 2,843,244 proposes an epoxy resin composition using a flame retardant having red phosphorus coated with a surface layer of $Si_xO_y$ although it still lacks moisture-proof reliability. JP-A 10-259292 discloses an epoxy resin composition in which a cyclic phosphazene compound is used in an amount to give 0.2–3.0% by weight of phosphorus atoms based on the total weight of other constituents excluding the filler. To provide flame retardance, a substantial amount of the cyclic phosphazene compound must be added to the epoxy resin composition, which can cause ineffective cure and a lowering of electrical resistance in a high-temperature environment.

SUMMARY OF THE INVENTION

An object of the invention is to provide a flame retardant epoxy resin composition for semiconductor encapsulation which is effectively moldable and cures into a product having improved flame retardance and moisture-proof reliability despite the absence of bromides (e.g., brominated epoxy resins) and antimony compounds (e.g., antimony trioxide). Another object is to provide a semiconductor device encapsulated with the composition in the cured state.

We have found that a semiconductor encapsulating, flame retardant epoxy resin composition comprising (A) an epoxy resin, (B) a curing agent, (C) an inorganic filler, and (D) a phosphazene compound of the average compositional formula (1), shown below, having a melting point of 110 to 130° C., and substantially free of bromides and antimony compounds is effectively moldable and cures into a product having improved flame retardance and moisture-proof reliability. A semiconductor device encapsulated with the epoxy resin composition in the cured state is improved in flame retardance and moisture-proof reliability.

Accordingly, the present invention provides a semiconductor encapsulating, flame retardant epoxy resin composition comprising as essential components,
(A) an epoxy resin,
(B) a curing agent,
(C) an inorganic filler, and
(D) a phosphazene compound of the average compositional formula (1) having a melting point of 110 to 130° C.,

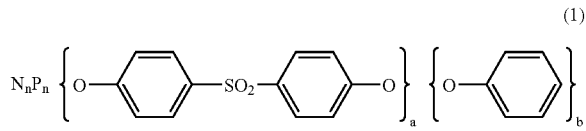

(1)

wherein the subscripts a, b and n are numbers satisfying $0<a\leq0.05n$, $1.90n\leq b<2n$, $2a+b=2n$, and $3\leq n\leq 6$, the composition being substantially free of bromides and antimony compounds.

Also contemplated herein is a semiconductor device encapsulated with a cured product of the epoxy resin composition.

As stated above, the epoxy resin composition of the invention is substantially free of bromides and antimony compounds. Although brominated epoxy resins and antimony trioxide are generally included in conventional epoxy resin compositions in order to impart flame retardance thereto, the epoxy resin composition of the invention clears the flame retardant specifications, UL-94, V-0 without resorting to brominated epoxy resins and antimony trioxide.

In the prior art, studies were conducted on the use of hydroxides such as $Al(OH)_3$ and $Mg(OH)_2$ or phosphorus-based fire retardants such as red phosphorus and phosphates in place of the brominated epoxy resins and antimony trioxide. Unfortunately, these known alternative flame retardants have the common drawback that they are less resistant to water, especially at elevated temperatures, so that they are dissolved and decomposed to increase impurity ions in the extracting water. As a consequence, if semiconductor devices encapsulated with conventional flame retarded epoxy resin compositions substantially free of bromides and antimony compounds are kept in a hot humid environment for a long period of time, the aluminum conductors in the devices can be corroded, detracting from moisture-proof reliability.

Addressing the above concerns, we have discovered that a semiconductor encapsulating epoxy resin composition using as a flame retardant (D) a phosphazene compound of the average compositional formula (1) having a melting point of 110 to 130° C. does not increase impurity ions in the extracting water, is effectively moldable and cures into a product having improved flame retardance and moisture-proof reliability. This phosphazene compound is fully resistant to water and does not increase impurity ions in the extracting water.

DETAILED DESCRIPTION OF THE INVENTION

Figure 1:
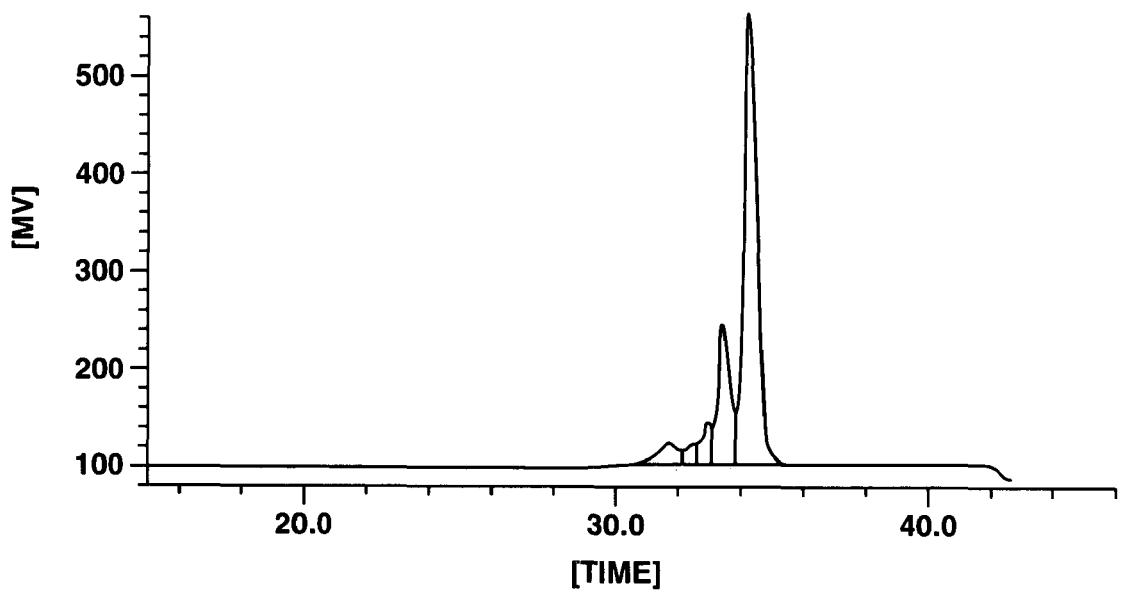
FIG. 1 is a gel permeation chromatography (GPC) chart of phosphazene compound SPE-100.

Component (A) in the epoxy resin composition of the invention is an epoxy resin which is not critical as long as it contains at least two epoxy groups in a molecule. Illustrative examples of suitable epoxy resins include novolac type epoxy resins, cresol novolac type epoxy resins, triphenolalkane type epoxy resins, aralkyl type epoxy resins, biphenyl skeleton-containing aralkyl type epoxy resins, biphenyl type epoxy resins, dicyclopentadiene type epoxy resins, heterocyclic epoxy resins, naphthalene ring-containing epoxy resins, bisphenol A type epoxy compounds, bisphenol F type epoxy compounds, and stilbene type epoxy resins. These epoxy resins may be employed alone or in combination of two or more. Brominated epoxy resins are excluded.

The epoxy resin used herein preferably has a hydrolyzable chlorine content of up to 1,000 ppm, especially up to 500 ppm and sodium and potassium contents of up to 10 ppm for each. If the content of hydrolyzable chlorine is more than 1,000 ppm or if the content of sodium or potassium is more than 10 ppm, moisture resistance may degrade when the encapsulated semiconductor device is long held in a hot humid environment.

Component (B) is a curing agent which is not critical as well. Most often, phenolic resins are used as the curing agent. Illustrative examples of typical phenolic resin curing agents include phenolic novolac resins, naphthalene ring-containing phenolic resins, aralkyl type phenolic resins, triphenolalkane type phenolic resins, biphenyl skeleton-containing aralkyl type phenolic resins, biphenyl type phenolic resins, alicyclic phenolic resins, heterocyclic phenolic resins, and bisphenol-type phenolic resins such as bisphenol A and bisphenol F type phenolic resins. These phenolic resins may be employed alone or in combination of two or more.

Like the epoxy resin, the curing agent used herein preferably has sodium and potassium contents of up to 10 ppm for each. If the content of sodium or potassium is more than 10 ppm, moisture resistance may degrade when the encapsulated semiconductor device is long held in a hot humid environment.

The amount of the curing agent used is not critical as long as it is effective to cure the epoxy resin. When the curing agent is a phenolic resin, it is preferably used in such amounts that the molar ratio of phenolic hydroxyl groups in the curing agent to epoxy groups in the epoxy resin is in a range from 0.5 to 1.5, more preferably from 0.8 to 1.2.

In the practice of the invention, a curing accelerator is preferably used to promote the curing reaction between the epoxy resin and the curing agent. The curing accelerator may be any suitable substance that promotes the curing reaction. Illustrative, non-limiting examples of curing accelerators that may be used include phosphorus compounds such as triphenylphosphine, tributylphosphine, tri(p-methylphenyl)phosphine, tri(nonylphenyl)phosphine, triphenylphosphine triphenylborane, and tetraphenylphosphine tetraphenylborate; tertiary amine compounds such as triethylamine, benzyldimethylamine, α-methylbenzyldimethylamine, and 1,8-diazabicyclo[5.4.0]undecene-7 (DBU); and imidazole compounds such as 2-methylimidazole, 2-phenylimidazole, and 2-phenyl-4-methylimidazole.

The curing accelerator is blended in an effective amount to promote the curing reaction between the epoxy resin and the curing agent (typically phenolic resin), desirably in an amount of about 0.1 to 5 parts, more desirably about 0.5 to 2 parts by weight per 100 parts by weight of components (A), (B) and (D) combined, independent of whether it is a phosphorus compound, tertiary amine compound or imidazole compound as stated above.

The inorganic filler (C) included in the epoxy resin compositions of the invention may be any suitable inorganic filler commonly used in epoxy resin compositions. Illustrative examples include silicas such as fused silica and crystalline silica, alumina, silicon nitride, aluminum nitride, boron nitride, titanium oxide, and glass fibers.

Although no particular limit is imposed on the mean particle size and shape of these inorganic fillers, spherical fused silica having a mean particle size of 5 to 30 μm is especially preferred.

Also the amount of the inorganic filler loaded is not critical. To enhance the flame retardance, the inorganic filler is preferably contained in the epoxy resin composition in a larger amount insofar as this does not compromise moldability. The amount of the inorganic filler (C) loaded is preferably 200 to 1,200 parts, more preferably 500 to 1,000 parts by weight per 100 parts by weight of components (A), (B) and (D) combined. With less than 200 parts of the filler, the composition may have such a coefficient of expansion that more stresses may be applied to the semiconductor device encapsulated therewith to detract from the device performance. More than 1,200 parts of the filler may reduce the fluidity of the composition noticeably and interfere with molding.

The inorganic filler used herein is preferably surface treated beforehand with a coupling agent in order to increase the bonding strength between the resin and the inorganic filler. Suitable coupling agents are silane and titanate coupling agents. Of these, silane coupling agents are preferred which include epoxy silanes such as γ-glycidoxypropyltrimethoxysilane, γ-glycidoxypropylmethyldiethoxysilane, and β-(3,4-epoxycyclohexyl)ethyltrimethoxysilane; amino silanes such as N-β-(aminoethyl)-γ-aminopropyltrimethoxysilane, γ-aminopropyltriethoxysilane, and N-phenyl-γ-aminopropyltrimethoxysilane; and mercapto silanes such as γ-mercaptosilane. No particular limitation is imposed on the amount of coupling agent used for surface treatment or the method of surface treatment.

Included in the semiconductor encapsulating, flame retardant epoxy resin composition of the invention is (D) a phosphazene compound of the average compositional formula (1) having a melting point of 110° C. to 130° C., (1)

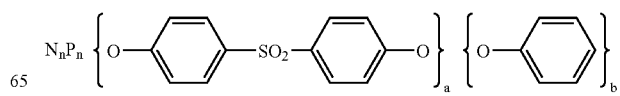

Herein the subscripts a, b and n are numbers satisfying $0<a\leq0.05n$, $1.90n\leq b<2n$, $2a+b=2n$, and $3\leq n\leq 6$.

In formula (1), n is from 3 to 6, preferably equal to 3. It is preferred that the phosphazene compound of formula (1) wherein n=3 account for at least 90% by weight of the entire phosphazene compound, that is, a proportion of n=3 be at least 90% by weight. The subscripts a, b and n are numbers satisfying $0<a\leq0.05n$, $1.90n\leq b<2n$, and $2a+b=2n$. If $0.05n<a$, then the phosphazene compound has a higher softening point due to more intermolecular crosslinks, and thus becomes less miscible with the epoxy resin, failing to achieve the desired flame retarding effects. The proportion of a is preferably $0.005n\leq a\leq 0.05n$. The proportion of b is preferably $1.90n\leq b\leq 1.99n$.

Figure 2:
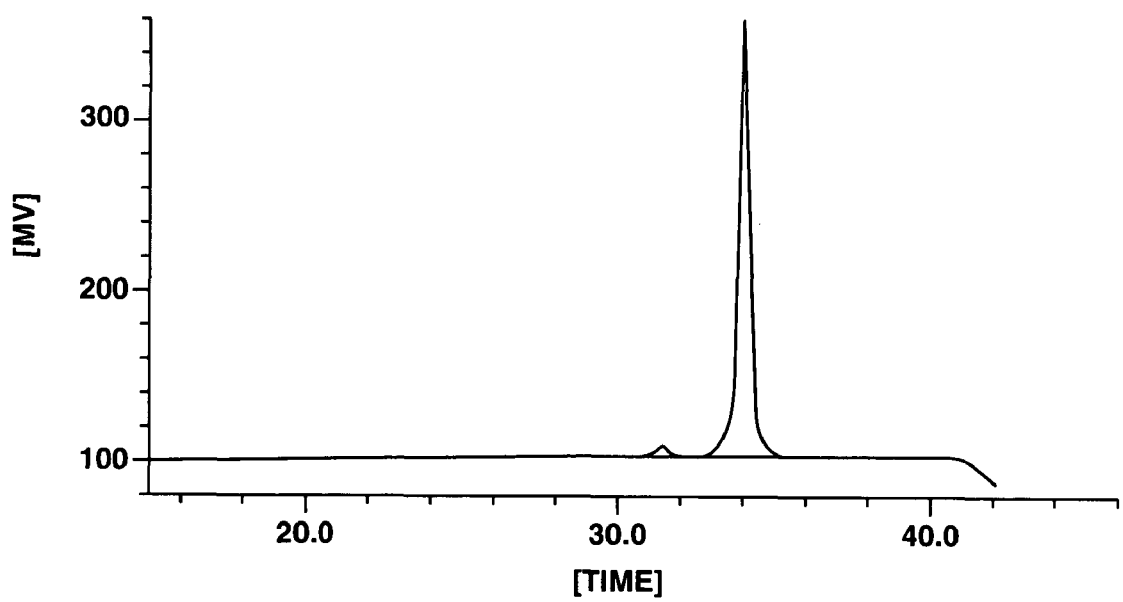
FIG. 2 is a GPC chart of phosphazene compound SPE-100 after recrystallization.
Figure 3:
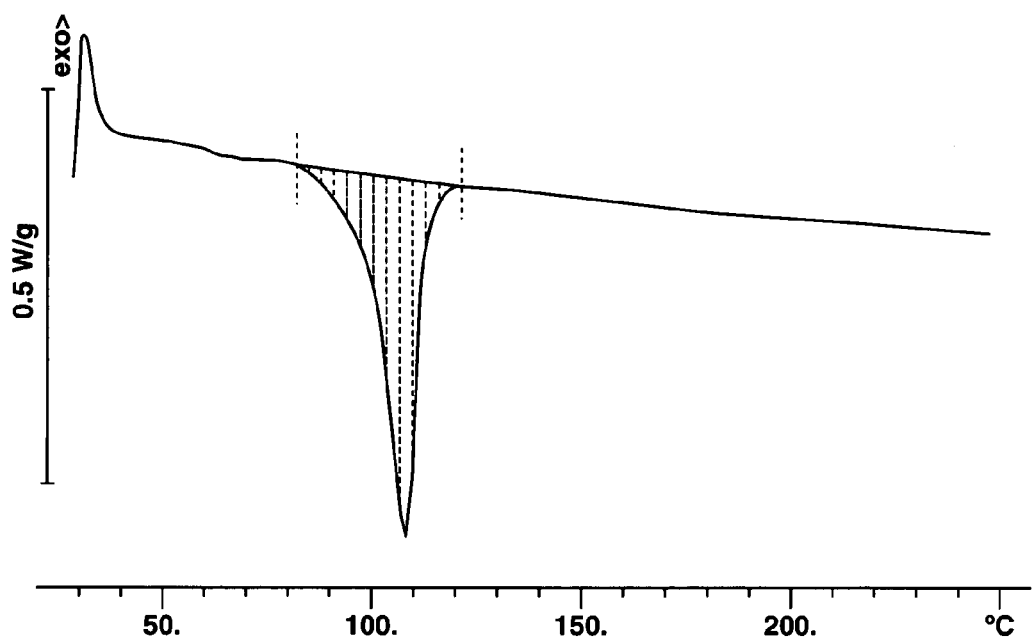
FIG. 3 is a differential scanning calorimetry (DSC) chart of phosphazene compound SPE-100.
Figure 4:
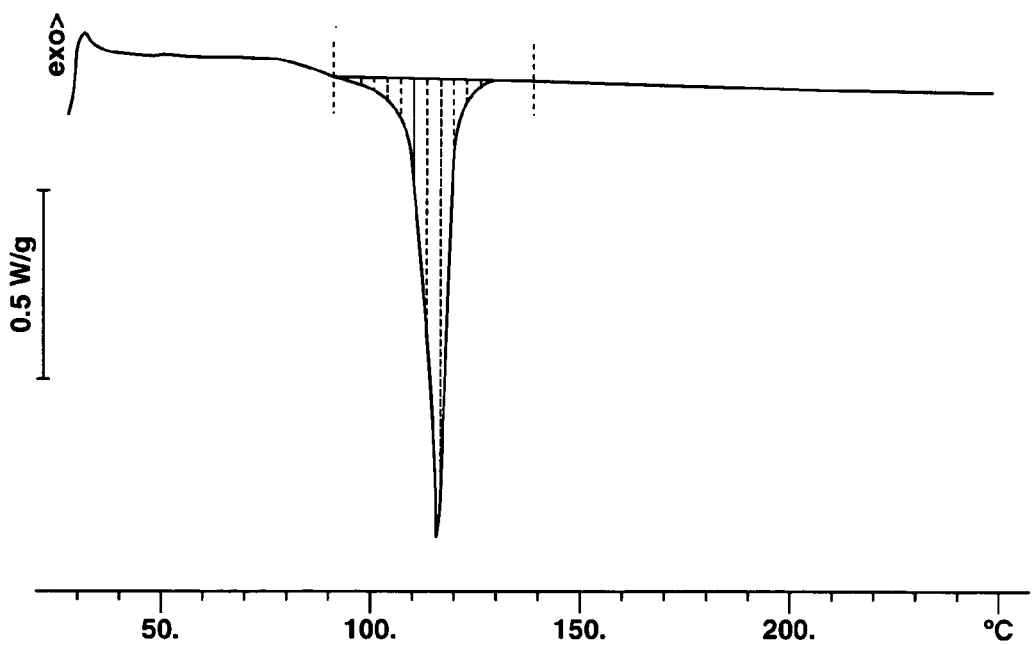
FIG. 4 is a DSC chart of phosphazene compound SPE-100 after recrystallization.

Desirably, the phosphazene compound of formula (1) has been recrystallized for the purpose of removing impurities such as phosphoric acid and chlorides. Through recrystallization, a highly crystalline compound wherein n=3 is selectively available with the resultant increase of melting point. Illustratively, FIGS. 1 and 2 are GPC charts of a phosphazene compound SPE-100 (Otsuka Chemical Co., Ltd.) which has not been recrystallized and a compound obtained from the same through recrystallization, respectively. The molecular weight distribution is determined from the peak area of the GPC chart. Through recrystallization of SPE-100, the proportion of compound wherein n=3 increases from 72 wt % to 90 wt % or higher. At the same time, the melting point increases from 108° C. to 114° C., as seen from the DSC charts of FIGS. 3 and 4.

The recrystallization is also effective for reducing the amount of total phosphate ions which can be extracted from the phosphazene compound with hot water. Then, as compared with epoxy resin compositions to which phosphorus-based flame retardants like red phosphorus and phosphates are added, the semiconductor encapsulating, flame retardant epoxy resin composition to which the phosphazene compound of formula (1) is added affords a cured product having improved hot water extraction properties and significantly improved moisture-proof reliability. It is noted that the amount of total phosphate ions is determined as follows. An epoxy resin composition is molded into a disk having a diameter of 50 mm and a thickness of 3 mm under conditions: temperature 175° C., molding pressure 6.9 N/mm$^2$ and molding time 120 seconds, and post-cured at 180° C. for 4 hours. In a disk mill, the disk is then ground into particles, from which 10 g of a fraction having a particle size of 50 to 212 μm is collected. The powder fraction is added to 50 ml of pure water, which is heated at 125° C. for 20 hours for extraction. Finally, the concentration of total phosphate ions in the filtrate is measured by ICP spectroscopy. For the semiconductor encapsulating, flame retardant epoxy resin composition of the invention, the concentration of total phosphate ions measured under the above-mentioned conditions should preferably be up to 20 ppm, more preferably up to 10 ppm.

The recrystallization of the phosphazene compound of formula (1) can be carried out by a conventional technique using suitable solvents. The solvents used for recrystallization are not critical as long as they are a combination of a rich solvent capable of dissolving the phosphazene compound with a poor solvent in which the phosphazene compound is insoluble. Suitable rich solvents include ketones such as acetone and methyl isobutyl ketone (MIBK), and aromatic hydrocarbons such as benzene, toluene and xylene. Suitable poor solvents include aliphatic hydrocarbons such as hexane and alcohols such as methanol and ethanol. The solvents used for recrystallization should desirably contain less impurities.

An appropriate amount of the phosphazene compound (D) added is 1 to 50% by weight, more preferably 2 to 20% by weight based on the total weight of components (A), (B) and (D). Less than 1% by weight of the phosphazene compound may fail to achieve the desired flame retardance whereas more than 50% by weight of the phosphazene compound may reduce the fluidity of the composition.

The epoxy resin composition of the invention may contain a molybdenum ingredient having zinc molybdate supported on an inorganic filler as an additional flame retardant. The use of such a molybdenum ingredient in combination with the phosphazene compound (D) achieves a higher level of flame retardance and minimizes the amount of the phosphazene compound (D) used. The molybdenum ingredient is also expected to serve as an ion trapping agent.

Suitable inorganic fillers on which zinc molybdate is supported include silicas such as fused silica and crystalline silica, talc, alumina, silicon nitride, aluminum nitride, boron nitride, titanium oxide, zinc oxide, and glass fibers. The inorganic filler should preferably have a mean particle size of 0.1 to 40 μm, and more preferably 0.5 to 15 μm and a specific surface area of 0.5 to 50 m$^2$/g, and more preferably 0.7 to 10 m$^2$/g. It is noted that the mean particle size can be determined as the weight average value or median diameter by the laser light diffraction technique, for example, and the specific surface area is determined by the BET adsorption method, for example.

In the molybdenum ingredient having zinc molybdate supported on the inorganic filler, the content of zinc molybdate is preferably 5 to 40% by weight, more preferably 10 to 30% by weight. Less contents of zinc molybdate may fail to provide satisfactory flame retardance whereas excessive contents may detract from flow during molding and curability.

The molybdenum ingredient in the form of zinc molybdate on inorganic filler is commercially available under the trade name of KEMGARD 1260, 1261, 911B and 911C from Sherwin-Williams Co.

An appropriate amount of the molybdenum ingredient blended is 3 to 100 parts, more preferably 5 to 100 parts by weight per 100 parts by weight of components (A), (B), and (D) combined. Less than 3 parts of the molybdenum ingredient may fail to provide satisfactory flame retardance whereas more than 100 parts may detract from flow and curability. The molybdenum ingredient comprising zinc molybdate supported on inorganic filler is added in such amounts that 0.1 to 40 parts, especially 0.2 to 40 parts by weight of zinc molybdate is present per 100 parts by weight of the epoxy resin and the curing agent combined. Less than 0.1 part by weight of zinc molybdate may fail to provide satisfactory flame retardance whereas more than 40 parts by weight of zinc molybdate may detract from flow and curability.

The semiconductor encapsulating, flame retardant epoxy resin composition of the invention may further include other flame retardants, for example, hydroxides such as aluminum hydroxide and magnesium hydroxide, inorganic compounds such as zinc borate and zinc stannate, and silicone compounds as long as the objects and benefits of the invention are not impaired. Note that antimony compounds such as antimony trioxide are excluded. Also preferably, phosphorus base flame retardants such as red phosphorus and phosphates (other than phosphazene compound) should be excluded.

The inventive epoxy resin composition may also include various additives, if necessary and as long as the objects of the invention are not impaired. Illustrative examples include stress-lowering additives such as thermoplastic resins, thermoplastic elastomers, synthetic organic rubbers, and silicones; waxes such as carnauba wax, higher fatty acids and synthetic waxes; colorants such as carbon black; and halogen trapping agents.

The inventive epoxy resin compositions may be prepared as a molding material by compounding the epoxy resin, curing agent, inorganic filler, phosphazene compound, and optional additives in predetermined proportions, thoroughly mixing these components together in a mixer or other appropriate apparatus, then melting and working the resulting mixture using a hot roll mill, kneader, extruder or the like. The worked mixture is then cooled and solidified, and subsequently ground to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by post-curing at about 150 to 180° C. for about 2 to 16 hours.

The semiconductor encapsulating, flame retardant epoxy resin compositions of the invention are effectively molded and cured into products which have excellent flame retardance and reliability against moisture. The compositions have no ill effects on human health and the environment because they do not contain bromides such as brominated epoxy resins and antimony compounds such as antimony trioxide. The semiconductor devices encapsulated with the cured epoxy resin compositions of the invention remain fully flame retardant and reliable against moisture and are thus of great worth in the industry.

EXAMPLE

Examples of the invention and comparative examples are given below together with preparation example of phosphazene compound, for further illustrating the invention, but are not intended to limit the invention. All parts and percents are by weight.

Preparation Example A

The starting reagent was a phosphazene compound of the average compositional formula (2) having a melting point of 108° C. (SPE-100 by Otsuka Chemical Co., Ltd., phosphorus atom content 11.0%, sulfur atom content 0.14%).

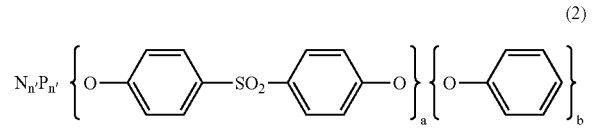

(2)

In formula (2), a, b and n' are numbers satisfying $0<a\leq 0.05n'$, $1.90n'\leq b<2n'$, $2a+b=2n'$, and $3\leq n'\leq 1000$. In a nitrogen atmosphere, 100 g of the phosphazene compound SPE-100 was dissolved in 225 g of toluene. After the solution became homogeneous, hexane was slowly added dropwise. The addition of hexane was stopped immediately before the solution became white turbid. The solution was allowed to stand in a refrigerator. The crystals precipitated were filtered out, washed with a mixture of toluene and hexane, extracted by separatory operation, and dried in vacuum. There was obtained 50 g of a phosphazene compound in white crystal form (melting point 114° C.). On fluorescent x-ray analysis, the compound had a phosphorus atom content of 11.6% and a sulfur atom content of 0.13%.

FIGS. 1 to 4 show the results of GPC and DSC analysis on the phosphazene compound SPE-100 and the product thereof after recrystallization (that is, the compound obtained in Preparation Example A).

Examples 1–4 and Comparative Examples 1–5

Epoxy resin compositions for semiconductor encapsulation were prepared by uniformly melt mixing the components shown in Table 1 on a hot twin-roll mill, followed by cooling and grinding. Properties of these compositions were measured by the following methods. The results are shown in Table 2.

(i) Spiral Flow

Measured under conditions: temperature 175° C., molding pressure 6.9 N/mm² and molding time 120 seconds using a mold in accordance with EMMI standards.

(ii) Gel Time

The gel time was measured as the time until the epoxy resin composition gelled on a hot plate at 175° C.

(iii) Hardness when Molded

In accordance with JIS-K6911, a rod measuring 10×4×100 mm was molded from the epoxy resin composition at a temperature of 175° C. and a pressure of 6.9 N/mm² for a time of 90 seconds. The hardness when hot was measured with a Barcol Impressor.

(iv) Phosphate Ions in Extracting Water

A disk having a diameter of 50 mm and a thickness of 3 mm was molded from the epoxy resin composition at a temperature of 175° C. and a pressure of 6.9 N/mm² for a time of 120 seconds and post-cured for 4 hours at 180° C. In a disk mill, the disk was then ground into particles, from which 10 g of a fraction having a particle size of 50–212 μm was collected. The powder fraction was added to 50 ml of pure water, which was heated at 125° C. for 20 hours for extraction. The concentration of total phosphate ions in the filtrate was measured by ICP spectroscopy.

(v) Flame Retardance

A sheet of 1.5875 mm (1/16 inch) thick was molded and its flame retardance was rated in accordance with UL-94 burning test specifications.

(vi) Moisture Resistance

A silicon chip measuring 6×6 mm on which aluminum wiring had been formed was adhesively bonded to a 14-pin dual in-line package (DIP) frame (Alloy 42), and the aluminum electrodes on the chip surface were wire bonded to the lead frame using gold wire having a diameter of 30 μm. The epoxy resin composition was then molded over the chip at a temperature of 175° C. and a pressure of 6.9 N/mm² for a time of 120 seconds, and post-cured at 180° C. for 4 hours. Twenty packages thus obtained were left to stand for 500 hours in an atmosphere of 140° C. and RH 85% while being subjected to a bias voltage of −5 V DC. The number of packages in which aluminum corrosion arose was counted.

(vii) Reliability on High-temperature Storage

A silicon chip measuring 6×6 mm on which aluminum wiring had been formed was adhesively bonded to a 14-pin dual in-line package (DIP) frame (Alloy 42), and the aluminum electrodes on the chip surface were wire bonded to the lead frame using gold wire having a diameter of 30 μm. The epoxy resin composition was then molded over the chip at a temperature of 175° C. and a pressure of 6.9 N/mm² for a time of 120 seconds, and post-cured at 180° C. for 4 hours. Twenty packages thus obtained were left to stand for 500 hours in an atmosphere of 200° C. The cured resin was dissolved away using fuming nitric acid whereby the packages were unsealed. The tensile strength of gold wire was measured. Those samples in which the tensile strength after the test decreased below 70% of the initial value are rejected. The number of rejected samples per 20 samples is reported.

TABLE 1

| Formulation (pbw) | Example | | | | Comparative Example | | | | |
|---|---|---|---|---|---|---|---|---|---|
| | 1 | 2 | 3 | 4 | 1 | 2 | 3 | 4 | 5 |
| Epoxy resin | 59 | 62 | 59 | 53 | 54 | 62 | 62 | 53 | 59 |
| Curing agent | 33 | 36 | 33 | 27 | 38 | 38 | 36 | 27 | 33 |
| Molybdenum ingredient | | 10 | 10 | 10 | | | | | 10 |
| Phosphazene compound — Compound of Preparation Example A | 8 | 2 | 8 | 20 | | | | | |
| Phosphazene compound — SPE-100 | | | | | | | 2 | 20 | 8 |
| Red Phosphorus | | | | | | 2 | | | |
| Brominated epoxy resin | | | | | 8 | | | | |
| Antimony trioxide | | | | | 10 | | | | |
| Inorganic filler | 600 | 600 | 600 | 600 | 600 | 600 | 600 | 600 | 600 |
| Curing catalyst | 1.0 | 1.0 | 1.0 | 1.0 | 1.0 | 1.0 | 1.0 | 1.0 | 1.0 |
| Parting agent | 1.5 | 1.5 | 1.5 | 1.5 | 1.5 | 1.5 | 1.5 | 1.5 | 1.5 |
| Carbon black | 1.5 | 1.5 | 1.5 | 1.5 | 1.5 | 1.5 | 1.5 | 1.5 | 1.5 |
| Silane coupling agent | 1.0 | 1.0 | 1.0 | 1.0 | 1.0 | 1.0 | 1.0 | 1.0 | 1.0 |

Epoxy resin: o-cresol novolac epoxy resin, EOCN 1020-55 by Nippon Kayaku Co., Ltd. (epoxy equivalent 200)
Curing agent: phenol novolac resin, DL-92 by Meiwa Kasei K.K. (phenolic hydroxyl equivalent 110)
Molybdenum ingredient: Zinc molybdate on core, KEMGARD 911C by Sherwin-Williams Co. (zinc molybdate content 18 wt %, core: talc with a mean particle size 2.0 μm and a specific surface area 2.0 m$^2$/g)
Inorganic filler: Spherical fused silica (mean particle size 20 μm) by Tatsumori K.K.
Curing catalyst: DBU by Sun Apollo K.K.
Parting agent: Carnauba wax by Nikko Fine Products K.K.
Carbon black: Denka Black by Denki Kagaku Kogyo K.K.
Silane coupling agent: KBM403 (γ-glycidoxypropyltrimethoxy-silane) by Shin-Etsu Chemical Co., Ltd.

TABLE 2

| Test results | Example | | | | Comparative Example | | | | |
|---|---|---|---|---|---|---|---|---|---|
| | 1 | 2 | 3 | 4 | 1 | 2 | 3 | 4 | 5 |
| Spiral flow (cm) | 85 | 80 | 83 | 85 | 83 | 83 | 80 | 85 | 85 |
| Gel time (sec) | 17 | 17 | 17 | 19 | 17 | 17 | 17 | 19 | 17 |
| Hardness when molded | 85 | 88 | 84 | 80 | 84 | 88 | 83 | 80 | 85 |
| Phosphate ions in extracting water (ppm) | 1 | <1 | 1 | 5 | 1 | 200 | 17 | 30 | 24 |
| Flame retardance | V-1 | V-1 | V-0 | V-0 | V-0 | V-0 | burned down | V-0 | V-0 |
| Moisture resistance | 0/20 | 0/20 | 0/20 | 0/20 | 0/20 | 20/20 | 0/20 | 10/20 | 8/20 |
| Reliability on high-temperature storage | 0/20 | 0/20 | 0/20 | 0/20 | 20/20 | 0/20 | 0/20 | 0/20 | 0/20 |

It is evident from Table 2 that the semiconductor encapsulating epoxy resin compositions of the invention are effectively molded and cured into products which have excellent flame retardance and reliability against moisture as well as a low level of extractable phosphate ions. The semiconductor devices encapsulated with the inventive epoxy resin compositions remain fully flame retardant and reliable against moisture. The compositions have no ill effects on human health and the environment because they do not contain bromides such as brominated epoxy resins and antimony compounds such as antimony trioxide.

Japanese Patent Application No. 2002-297352 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:
1. A semiconductor encapsulating, flame retardant epoxy resin composition comprising as essential components,
(A) an epoxy resin,
(B) a curing agent,
(C) an inorganic filler, and
(D) a phosphazene compound of the average compositional formula (1) having a melting point of 110 to 130° C.,

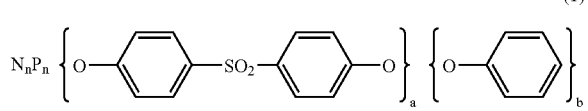

(1)

wherein the subscripts a, b and n are numbers satisfying $0 < a \leq 0.05n$, $1.90n \leq b < 2n$, $2a+b=2n$, and $3 \leq n \leq 6$, a proportion of n=3 of at least 90% by weight,
the composition being substantially free of bromides and antimony compounds.

2. The epoxy resin of claim 1 wherein the phosphazene compound of formula (1) is obtained by recrystallization.

3. The epoxy resin composition of claim 1, further comprising a molybdenum ingredient having zinc molybdate supported on an inorganic filler.

4. The epoxy resin composition of claim 1 wherein when the composition is extracted with hot water, the concentration of phosphate ions in the extracting water is up to 20 ppm.

5. A semiconductor device encapsulated with the epoxy resin composition of claim 1 in a cured state.

6. The epoxy resin composition of claim 1 wherein the phosphazene compound (D) is obtained through recrystallization.

* * * * *